United States Patent
Long et al.

(10) Patent No.: US 7,704,554 B2
(45) Date of Patent: *Apr. 27, 2010

(54) DEVICE AND METHOD FOR VAPORIZING TEMPERATURE SENSITIVE MATERIALS

(75) Inventors: Michael Long, Hilton, NY (US); Randolph C. Brost, Albuquerque, NM (US); Jeremy M. Grace, Penfield, NY (US); Dennis R. Freeman, Spencerport, NY (US); Neil P. Redden, Sodus Point, NY (US); Bruce E. Koppe, Caledonia, NY (US)

(73) Assignee: Global Oled Technology LLC, Wilmington, DE (US)

( * ) Notice: Subject to any disclaimer, the term of this patent is extended or adjusted under 35 U.S.C. 154(b) by 338 days.

This patent is subject to a terminal disclaimer.

(21) Appl. No.: 11/745,504

(22) Filed: May 8, 2007

(65) Prior Publication Data
US 2007/0207261 A1    Sep. 6, 2007

Related U.S. Application Data

(62) Division of application No. 10/784,585, filed on Feb. 23, 2004, now Pat. No. 7,232,588.

(51) Int. Cl.
*C23C 16/00* (2006.01)
(52) U.S. Cl. .................. 427/248.1; 427/255.6
(58) Field of Classification Search .......... 427/248.1, 427/255.6, 69, 70; 118/726
See application file for complete search history.

(56) References Cited

U.S. PATENT DOCUMENTS

| | | | |
|---|---|---|---|
| 2,447,789 A | | 8/1948 | Barr |
| 4,293,594 A | * | 10/1981 | Yoldas et al. ............... 427/107 |
| 4,470,370 A | | 9/1984 | Rachor et al. |
| 4,724,106 A | * | 2/1988 | Morimoto et al. .......... 264/439 |

(Continued)

FOREIGN PATENT DOCUMENTS

EP    0982411    3/2000

(Continued)

OTHER PUBLICATIONS

Bruun, Johannes H., et al., "Organic Combustion Apparatus for Highly Volatile and for Inflammable Liquids". Ind. Eng. Chem. Anal. Ed., 1936, 8 (4), pp. 315-316.*

(Continued)

*Primary Examiner*—Bret Chen
(74) *Attorney, Agent, or Firm*—Morgan Lewis & Bockius LLP

(57) ABSTRACT

A method for vaporizing organic materials onto a substrate surface to form a film including providing a quantity of organic material into a vaporization apparatus and actively maintaining the organic material in a first heating region in the vaporization apparatus to be below the vaporization temperature. The method also includes heating a second heating region of the vaporization apparatus above the vaporization temperature of the organic material and metering, at a controlled rate, organic material from the first heating region into the second heating region so that a thin cross section of the organic material is heated at a desired rate-dependent vaporization temperature, whereby organic material vaporizes and forms a film on the substrate surface.

8 Claims, 3 Drawing Sheets

U.S. PATENT DOCUMENTS

| | | | |
|---|---|---|---|
| 4,769,292 | A | 9/1988 | Tang et al. |
| 4,885,211 | A | 12/1989 | Tang et al. |
| 5,034,025 | A * | 7/1991 | Overmann, III ................ 95/52 |
| 5,041,719 | A | 8/1991 | Harris et al. |
| 5,849,089 | A | 12/1998 | Tsunashima et al. |
| 6,179,923 | B1 | 1/2001 | Yamamoto et al. |
| 6,331,211 | B1 | 12/2001 | Xu et al. |
| 6,340,501 | B1 | 1/2002 | Kamiyama et al. |
| 6,467,427 | B1 | 10/2002 | Peng |
| 6,473,563 | B2 * | 10/2002 | Takamatsu et al. .......... 392/388 |
| 6,619,315 | B2 * | 9/2003 | Gill ........................... 137/486 |
| 6,660,328 | B1 | 12/2003 | Dahmen et al. |
| 6,696,096 | B2 | 2/2004 | Tsubaki et al. |
| 7,232,588 | B2 * | 6/2007 | Long et al. ............... 427/248.1 |
| 2002/0132047 | A1 | 9/2002 | Yamazaki et al. |
| 2003/0116091 | A1 | 6/2003 | Grant et al. |
| 2004/0016400 | A1 | 1/2004 | Kim et al. |
| 2004/0135749 | A1 * | 7/2004 | Kondakov et al. ............. 345/82 |
| 2005/0047979 | A1 | 3/2005 | Jang et al. |
| 2005/0072361 | A1 | 4/2005 | Yang et al. |
| 2005/0186340 | A1 * | 8/2005 | Long et al. ................ 427/248.1 |
| 2006/0096850 | A1 * | 5/2006 | Kozaki et al. ............ 204/157.3 |
| 2007/0172400 | A1 * | 7/2007 | Kitamura et al. ............. 422/189 |
| 2008/0176468 | A1 * | 7/2008 | Chen ............................. 442/1 |

FOREIGN PATENT DOCUMENTS

| | | |
|---|---|---|
| GB | 1253124 | 11/1971 |
| JP | 05117864 | 5/1993 |

OTHER PUBLICATIONS

Meng, G.Y, et al., "Progress in ion-transport inorganic membranes by novel chemical vapor deposition (CVD) techniques". Thin Solid Films, vol. 409, Issue 1, Apr. 22, 2002, pp. 105-111.*

* cited by examiner

DEVICE AND METHOD FOR VAPORIZING TEMPERATURE SENSITIVE MATERIALS

CROSS REFERENCE TO RELATED APPLICATIONS

This application is a divisional of commonly-assigned U.S. patent application Ser. No. 10/784,585 filed Feb. 23, 2004, now U.S. Pat. No. 7,232,588 by Michael Long et al., entitled "Device and Method for Vaporizing Temperature Sensitive Materials", the disclosure of which is incorporated herein. Reference is made to commonly assigned U.S. patent application Ser. No. 10/352,558 filed Jan. 28, 2003 by Jeremy M. Grace et al., entitled "Method of Designing a Thermal Physical Vapor Deposition System", the disclosure of which is herein incorporated by reference.

FIELD OF THE INVENTION

The present invention relates to the field of physical vapor deposition where a source material is heated to a temperature so as to cause vaporization and produce a vapor plume to form a thin film on a surface of a substrate.

BACKGROUND OF THE INVENTION

An OLED device includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

Physical vapor deposition in a vacuum environment is the principal way of depositing thin organic material films as used in small molecule OLED devices. Such methods are well known, for example, Barr in U.S. Pat. No. 2,447,789 and Tanabe et al. in EP 0 982 411. The organic materials used in the manufacture of OLED devices are often subject to degradation when maintained at or near the desired rate-dependent vaporization temperature for extended periods of time. Exposure of sensitive organic materials to higher temperatures can cause changes in the structure of the molecules and associated changes in material properties.

To overcome the thermal sensitivity of these materials, only small quantities of organic materials have been loaded in sources, and they are heated as little as possible. In this manner, the material is consumed before it has reached the temperature exposure threshold to cause significant degradation. The limitations with this practice are that the available vaporization rate is very low due to the limitation on heater temperature, and the operation time of the source is very short due to the small quantity of material present in the source. The low deposition rate and frequent source recharging place substantial limitations on the throughput of OLED manufacturing facilities.

A secondary consequence of heating the entire organic material charge to roughly the same temperature is that it is impractical to mix additional organic materials, such as dopants, with a host material unless the vaporization behavior and vapor pressure of the dopant is very close to that of the host material. This is generally not the case and, as a result, prior art devices frequently require the use of separate sources to co-deposit host and dopant materials.

The organic materials used in OLED devices have a highly non-linear vaporization rate dependence on source temperature. A small change in source temperature leads to a very large change in vaporization rate. Despite this, prior art devices employ source temperature as the only way to control vaporization rate. To achieve good temperature control, prior art deposition sources typically utilize heating structures whose solid volume is much larger than the organic charge volume, composed of high thermal-conductivity materials that are well insulated. The high thermal conductivity insures good temperature uniformity through the structure, and the large thermal mass helps to maintain the temperature within a critically small range by reducing temperature fluctuations. These measures have the desired effect on steady-state vaporization rate stability but have a detrimental effect at start-up. It is common that these devices must operate for many hours at start-up before steady-state thermal equilibrium and hence a steady vaporization rate is achieved.

A further limitation of prior art sources is that the geometry of the vapor manifold changes as the organic material charge is consumed. This change requires that the heater temperature change to maintain a constant vaporization rate, and it is observed that the plume shape of the vapor exiting the orifices changes as a function of the organic material thickness and distribution in the source.

SUMMARY OF THE INVENTION

It is therefore an object of the present invention to provide a device and method for vaporizing organic materials while limiting their exposure to temperatures that can cause material degradation. It is a further object of this invention to permit a single source to deposit two or more organic material components. It is a further object of this invention to achieve a steady vaporization rate quickly. It is a further object to maintain a steady vaporization rate with a large charge of organic material and with a steady heater temperature.

This object is achieved by a method for vaporizing organic materials onto a substrate surface to form a film, comprising:

a) providing a quantity of organic material into a vaporization apparatus;

b) actively maintaining the organic material in a first heating region in the vaporization apparatus to be below the vaporization temperature;

c) heating a second heating region of the vaporization apparatus above the vaporization temperature of the organic material; and d) metering, at a controlled rate, organic material from the first region into the second heating region so that a thin cross section of the organic material is heated at a desired rate-dependent vaporization temperature, whereby organic material sublimes and forms a film on the substrate surface.

ADVANTAGES

It is an advantage of the present invention that the device overcomes the heating and volume limitations of prior art devices in that only a small portion of organic material is heated to the desired rate-dependent vaporization temperature at a controlled rate. It is therefore a feature of the present invention to maintain a steady vaporization rate with a large charge of organic material and with a steady heater temperature. The device thus permits extended operation of the source with substantially reduced risk of degrading even very temperature sensitive organic materials. This feature additionally permits materials having different vaporization rates and degradation temperature thresholds to be co-sublimated in the same source.

It is a further advantage of the present invention that it permits finer rate control and additionally offers an independent measure of the vaporization rate.

It is a further advantage of the present invention that it can be cooled and reheated in a matter of seconds to stop and reinitiate vaporization and achieve a steady vaporization rate quickly. This feature minimizes contamination of the deposition chamber walls and conserves the organic materials when a substrate is not being coated.

It is a further advantage that the present device achieves substantially higher vaporization rates than in prior art devices without material degradation. Further still, no heater temperature change is required as the source material is consumed.

It is a further advantage of the present invention that it can provide a vapor source in any orientation, which is not possible with prior art devices.

DETAILED DESCRIPTION OF THE INVENTION

Figure 1:
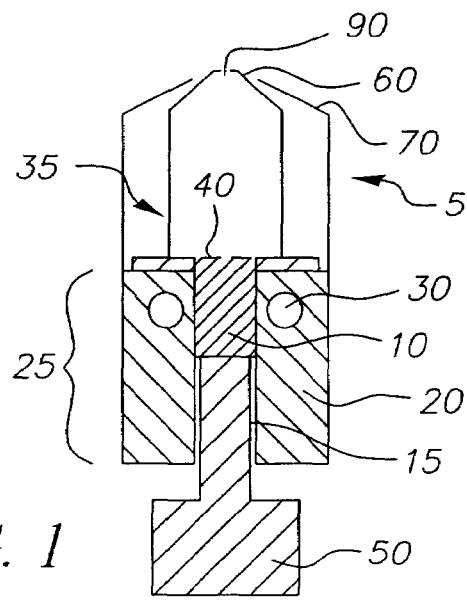
FIG. 1 is a cross-sectional view of one embodiment of a device according to the present invention including a piston and a drive mechanism as a way for metering organic material into a heating region.

Turning now to FIG. 1, there is shown a cross-sectional view of one embodiment of a device of this disclosure. Vaporization apparatus 5 is a device for vaporizing organic materials onto a substrate surface to form a film, and includes a first heating region 25 and a second heating region 35 spaced from first heating region 25. First heating region 25 includes a first heating means represented by base block 20, which can be a heating base block or a cooling base block, or both, and which can include control passage 30. Chamber 15 can receive a quantity of organic material 10. Second heating region 35 includes the region bounded by manifold 60 and permeable member 40, which can be part of manifold 60. Manifold 60 also includes one or more apertures 90. A way of metering organic material includes chamber 15 for receiving the organic material 10, piston 50 for raising organic material 10 in chamber 15, as well as permeable member 40. Vaporization apparatus 5 also includes one or more shields 70.

Figure 2:
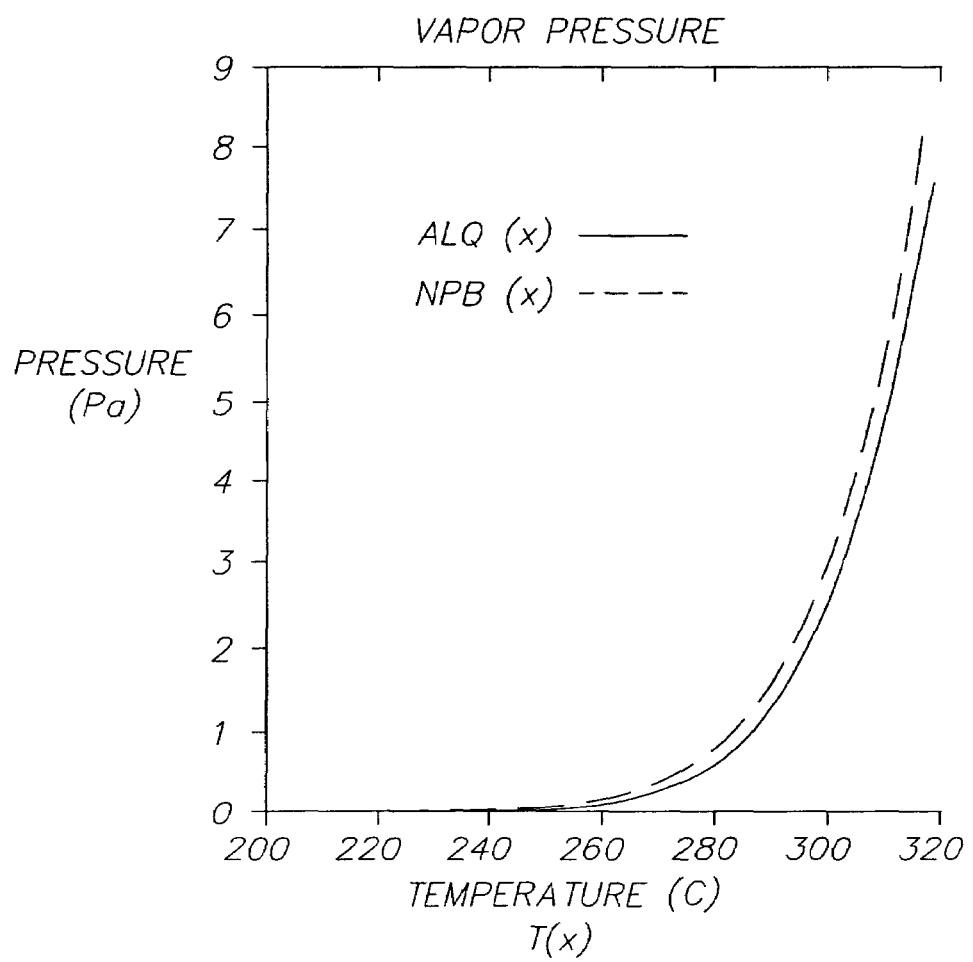
FIG. 2 shows a graphical representation of vapor pressure vs. temperature for two organic materials.

Organic material 10 is preferably either a compacted or pre-condensed solid. However, organic material in powder form is also acceptable. Organic material 10 can comprise a single component, or can comprise two or more organic components, each one having a different vaporization temperature. Organic material 10 is in close thermal contact with the first heating means that is base block 20. Control passages 30 through this block permit the flow of a temperature control fluid, that is, a fluid adapted to either absorb heat from or deliver heat to the first heating region 25. The fluid can be a gas or a liquid or a mixed phase. Vaporization apparatus 5 includes a way for pumping fluid through control passages 30. Such pumping means, not shown, are well known to those skilled in the art. Through such means, organic material 10 is heated in first heating region 25 until it is a temperature below its vaporization temperature. The vaporization temperature can be determined by various ways. For example. FIG. 2 shows a graphical representation of vapor pressure versus temperature for two organic materials commonly used in OLED devices. The vaporization rate is proportional to the vapor pressure, so for a desired vaporization rate, the data in FIG. 2 can be used to define the required heating temperature corresponding to the desired vaporization rate. First heating region 25 is maintained at a constant heater temperature as organic material 10 is consumed.

Organic material 10 is metered at a controlled rate from first heating region 25 to second heating region 35. Second heating region 35 is heated to a temperature above the vaporization temperature of organic material 10, or each of the organic components thereof. Because a given organic component vaporizes at different rates over a continuum of temperatures, there is a logarithmic dependence of vaporization rate on temperature. In choosing a desired deposition rate, one also determines a necessary vaporization temperature of organic material 10, which will be referred to as the desired rate-dependent vaporization temperature. The temperature of first heating region 25 is below the vaporization temperature, while the temperature of second heating region 35 is at or above the desired rate-dependent vaporization temperature. In this embodiment, second heating region 35 comprises the region bounded by manifold 60 and permeable member 40. Organic material 10 is pushed against permeable member 40 by piston 50, which can be controlled through a force-controlled drive mechanism. Piston 50, chamber 15, and the force-controlled drive mechanism comprise a way for metering. This metering means permits organic material 10 to be metered through permeable member 40 into second heating region 35 at a controlled rate that varies linearly with the vaporization rate. Along with the temperature of second heating region 35, this permits finer rate control of the vaporization rate of organic material 10 and additionally offers an independent measure of the vaporization rate. A thin cross-section of organic material 10 is heated to the desired rate-dependent temperature, which is the temperature of second heating region 35, by virtue of contact and thermal conduction, whereby the thin cross-section of organic material 10 vaporizes. In the case where organic material 10 comprises two or more organic components, the temperature of second heating region 35 is chosen to be above the vaporization temperature of each of the components so that each of the organic material 10 components simultaneously vaporizes. A steep thermal gradient on the order of 200° C./mm is produced through the thickness of organic material 10. This gradient protects all but the immediately vaporizing material from the high temperatures. The vaporized organic vapors rapidly pass through the permeable member 40 and can enter into a volume of heated gas manifold 60 or pass directly on to the target substrate. Their residence time at the desired vaporization temperature is very short and, as a result, thermal degradation is greatly reduced. The residence time of organic material 10 at elevated temperature, that is, at the rate-dependent vaporization temperature, is orders of magnitude less than prior art devices and methods (seconds vs. hours or days in the prior art), which permits heating organic material 10 to higher temperatures than in the prior art. Thus, the current device and method can achieve substantially higher vaporization rates, without causing appreciable degradation of organic material 10. The constant vaporization rate, and constant volume of vaporizing organic material 10 maintained in second heating region 35 establish and maintain a constant plume shape. The plume is herein defined as the vapor cloud exiting vaporization device 5.

Since second heating region 35 is maintained at a higher temperature than first heating region 25, it is possible that heat from second heating region 35 can raise the temperature of the bulk of organic material 10 above that of first heating region 25. Therefore, it is necessary that the first heating means can also cool organic material 10 after it rises above a predetermined temperature. This can be accomplished by varying the temperature of the fluid in control passage 30.

Where a manifold 60 is used, a pressure develops as vaporization continues and streams of vapor exit the manifold 60 through the series of apertures 90. The conductance along the length of the manifold is designed to be roughly two orders of magnitude larger than the sum of the aperture conductances as described in commonly assigned U.S. patent application Ser. No. 10/352,558 filed Jan. 28, 2003 by Jeremy M. Grace et al., entitled "Method of Designing a Thermal Physical Vapor Deposition System", the disclosure of which is herein incorporated by reference. This conductance ratio promotes good pressure uniformity within manifold 60 and thereby minimizes flow non-uniformities through apertures 90 distributed along the length of the source despite potential local non-uniformities in vaporization rate.

One or more heat shields 70 are located adjacent the heated manifold 60 for the purpose of reducing the heat radiated to the facing target substrate. These heat shields are thermally connected to base block 20 for the purpose of drawing heat away from the shields. The upper portion of shields 70 is designed to lie below the plane of the apertures for the purpose of minimizing vapor condensation on their relatively cool surfaces.

Because only a small portion of organic material 10, the portion resident in second heating region 35, is heated to the rate-dependent vaporization temperature, while the bulk of the material is kept well below the vaporization temperature, it is possible to interrupt the vaporization by a way of interrupting heating in second heating region 35, e.g. stopping the movement of piston 50. This can be done when a substrate surface is not being coated so as to conserve organic material 10 and minimize contamination of any associated apparatus, such as the walls of a deposition chamber, which will be described below.

Because permeable member 40 can be a fine mesh screen that prevents powder or compacted material from passing freely through it, vaporization apparatus 5 can be used in any orientation. For example, vaporization apparatus 5 can be oriented 180° from what is shown in FIG. 1 so as to coat a substrate placed below it. This is an advantage not found in the heating boats of the prior art.

Although one preferred embodiment has been the use of vaporization apparatus 5 with a powder or compressed material that sublimes when heated, in some embodiments organic material 10 can be a material that liquefies before vaporization, and can be a liquid at the temperature of first heating region 25. In such a case, permeable member 40 can absorb and retain liquefied organic material 10 in a controllable manner via capillary action, thus permitting control of vaporization rate.

In practice, vaporization apparatus 5 can be used as follows. A quantity of organic material 10, which can comprise one or more components, is provided into chamber 15 of vaporization apparatus 5. In first heating region 25, organic material 10 is actively maintained below the vaporization temperature of each of its organic components. Second heating region 35 is heated to a temperature above the vaporization temperature of organic material 10 or each of the components thereof. Organic material 10 is metered at a controlled rate from first heating region 25 to second heating region 35. A thin cross-section of organic material 10 is heated at a desired rate-dependent vaporization temperature, whereby organic material 10 vaporizes and forms a film on a substrate surface. When organic material 10 comprises multiple components, each component simultaneously vaporizes.

Figure 3:
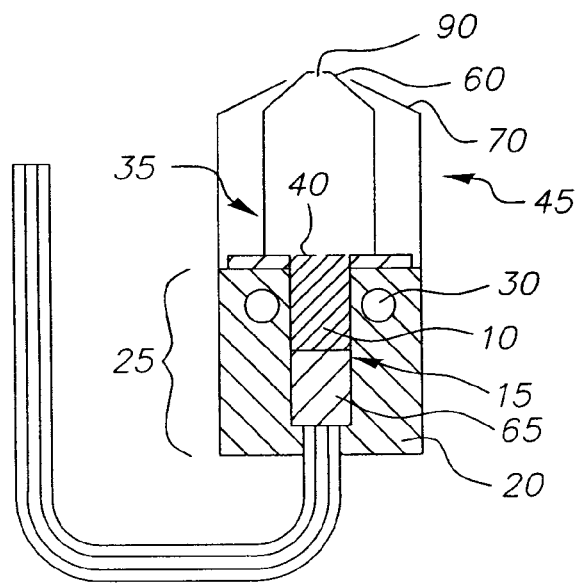
FIG. 3 is a cross-sectional view of another embodiment of a device according to the present invention including a liquid metal as a way for metering organic material into a heating region and to form a seal to prevent vapors from escaping.

FIG. 3 shows a cross-sectional view of a second embodiment of a device of this disclosure. Vaporization apparatus 45 includes first heating region 25, second heating region 35, base block 20, control passages 30, chamber 15, manifold 60, apertures 90, shields 70, and permeable member 40 as described above. Vaporization apparatus 45 does not include a piston, but instead includes liquid 65.

Organic material 10 can be as described above and is in close thermal contact with base block 20. Organic material 10 is metered at a controlled rate from first heating region 25 to second heating region 35, which is heated to a temperature above the vaporization temperature of organic material 10, or each of the components thereof. Organic material 10 is pushed against permeable member 40 through contact with a low vapor pressure liquid 65. Liquid 65 must be a liquid at the operating temperature of vaporization apparatus 45. For example, many organic materials commonly used in OLED devices have a vaporization temperature over 150° C. Therefore, it is sufficient that liquid 65 can be liquid at 150° C. for such organic materials. Liquid 65 can provide very good thermal contact and a vapor-tight seal between organic material 10 and base block 20. Low-melting liquid metals are suitable for this purpose, including gallium, alloys of gallium and indium, as well as controlled expansion alloys of bismuth and indium. These materials have high thermal conductivity and serve to provide very good thermal contact and a vapor-tight seal between the organic material and the cooling block. Also suitable are low-vapor-pressure oils. Other materials are acceptable as liquid 65 to the extent that they do not react with the organic material 10, have a higher density than organic material 10, and have a vapor pressure much lower than the vapor pressure of organic material 10 over the temperature range employed in vaporization apparatus 5. Organic material 10 floats on the surfaces of such high surface tension, dense liquids and can be pushed against permeable member 40 with a very controllable force. This controlled force, along with the temperature of permeable member 40, permits precise control of the vaporization rate of the organic material. A thin cross-section of organic material 10 is heated to a desired rate-dependent temperature, that is, the temperature of permeable member 40, by virtue of contact and thermal conduction, whereby the thin cross-section of organic material 10 vaporizes. A steep thermal gradient on the order of 200° C./mm is produced through the thickness of organic material 10. This gradient protects all but the immediately vaporizing material from the high temperatures. The vaporized organic vapors rapidly pass through the permeable member 40 and can enter into a volume of heated gas manifold 60 or pass directly on to the target substrate. Their residence time at the desired vaporization temperature is very short and, as a result, thermal degradation is greatly reduced.

Where a manifold 60 is used, a pressure develops as vaporization continues and streams of vapor exit the manifold 60 through the series of apertures 90. The conductance along the length of the manifold is designed to be roughly two orders of magnitude larger than the sum of the aperture conductances as described by Grace et al. This conductance ratio promotes good pressure uniformity within manifold 60 and thereby minimizes flow non-uniformities through apertures 90 distributed along the length of the source, despite potential local non-uniformities in vaporization rate.

Like vaporization apparatus 5, vaporization apparatus 45 can be adapted to the use of a liquid organic material 10.

Figure 4:
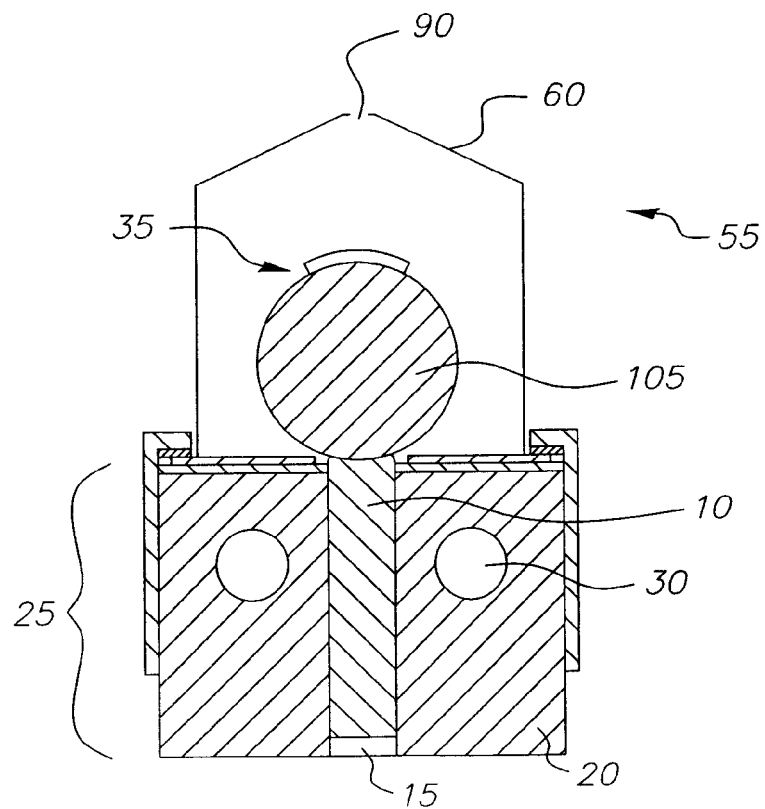
FIG. 4 is a cross-sectional view of a third embodiment of a device according to the present invention including a rotating drum having a surface pattern of recesses as a way for metering organic material into a heating region.

FIG. 4 shows a cross-sectional view of a third embodiment of a device of this disclosure. Vaporization apparatus 55 includes first heating region 25, base block 20, control passages 30, chamber 15, manifold 60, and apertures 90 as described above.

Organic material 10 can be as described above and is in close thermal contact with base block 20. Organic material 10 is pushed by either a piston or a liquid as described above against the periphery of rotating drum 105 and is carried as a fine powder film from first heating region 25 to second heating region 35. The powder can be attracted to the drum by electrostatic forces and rotating drum 105 can have surface features such as a knurled pattern or a pattern of small recesses having a definite volume in which a controlled volume of organic material 10 is contained so as to transport a fixed volume of powder. A wiper can optionally be used to remove excess powder from the surface of rotating drum 105. Rotating drum 105 is preferably constructed such that its surface has very little thermal mass, that is, the surface of rotating drum 105 is rapidly heated as it rotates to second heating region 35 and rapidly cools as it rotates back to first heating region 25.

Second heating region 35 includes a second heating means. The second heating means can be incorporated in the surface of rotating drum 105 through induction or RF coupling, it can include a radiant heating element in close proximity to the surface of rotating drum 105, or it can include resistance heating means. The vaporization rate in this embodiment is controlled by the rate of rotation of rotating drum 105, and the quantity of organic material 10 carried on its surface. The heating mechanism simply insures that substantially all of organic material 10 on the surface of rotating drum 105 is transformed to the vapor state. The vaporized organic vapors rapidly pass through second heating region 35, and can enter into a volume of heated gas manifold 60 or pass directly on to the target substrate. Their residence time at temperature is very short and, as a result, thermal degradation is greatly reduced.

Where a manifold 60 is used, a pressure develops as vaporization continues and streams of vapor exit the manifold 60 through the series of apertures 90. The conductance along the length of the manifold is designed to be roughly two orders of magnitude larger than the sum of the aperture conductances as described in commonly assigned U.S. patent application Ser. No. 10/352,558 filed Jan. 28, 2003 by Jeremy M. Grace et al., entitled "Method of Designing a Thermal Physical Vapor Deposition System", the disclosure of which is herein incorporated by reference. This conductance ratio promotes good pressure uniformity within manifold 60 and thereby minimizes flow non-uniformities through apertures 90 distributed along the length of the source, despite potential local non-uniformities in vaporization rate.

Like vaporization apparatus 5, vaporization apparatus 45 can be adapted to the use of a liquid organic material 10.

Figure 5:
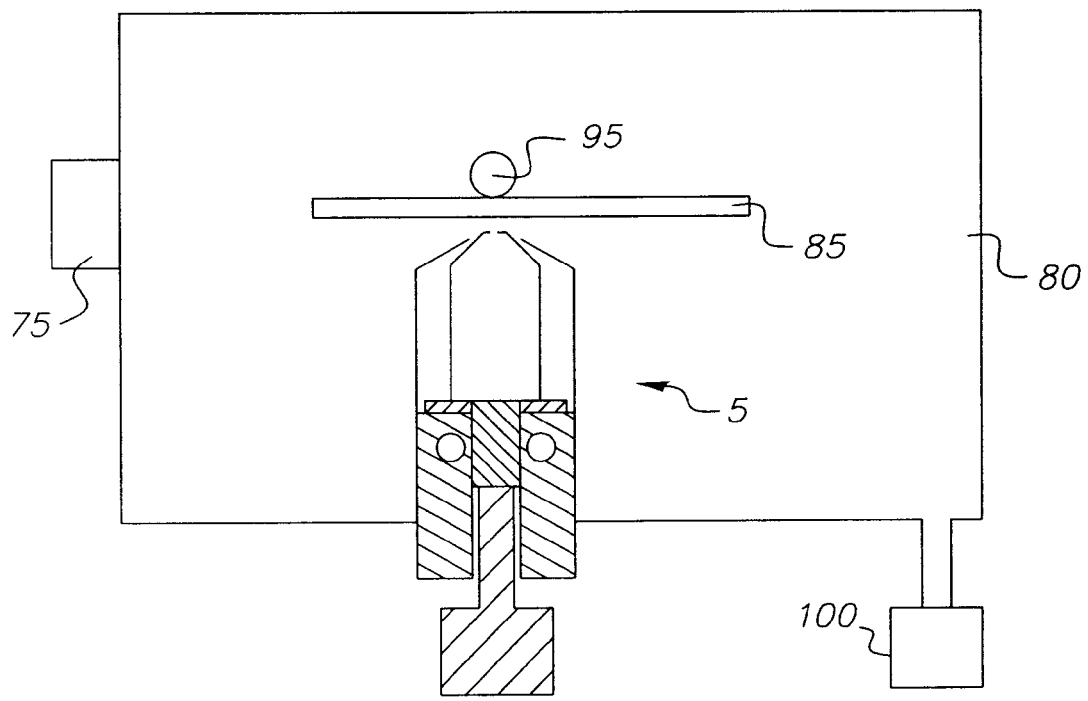
FIG. 5 is a cross-sectional view of a device according to the present invention including a deposition chamber enclosing a substrate.

Turning now to FIG. 5, there is shown an embodiment of a device of this disclosure including a deposition chamber enclosing a substrate. Deposition chamber 80 is an enclosed apparatus that permits an OLED substrate 85 to be coated with organic material 10 transferred from vaporization apparatus 5. Deposition chamber 80 is held under controlled conditions, e.g. a pressure of 1 Torr or less provided by vacuum source 100. Deposition chamber 80 includes load lock 75 which can be used to load uncoated OLED substrates 85, and unload coated OLED substrates. OLED substrate 85 can be moved by translational apparatus 95 to provide even coating of vaporized organic material 10 over the entire surface of OLED substrate 85. Although vaporization apparatus is shown as partially enclosed by deposition chamber 80, it will be understood that other arrangements are possible, including arrangements wherein vaporization apparatus 5 is entirely enclosed by deposition chamber 80.

In practice, an OLED substrate 85 is placed in deposition chamber 80 via load lock 75 and held by translational apparatus 95 or associated apparatus. Vaporization apparatus 5 is operated as described above, and translational apparatus 95 moves OLED substrate 85 perpendicular to the direction of emission of organic material 10 vapors from vaporization apparatus 5, thus forming a film of organic material 10 on the surface of OLED substrate 85.

Figure 6:
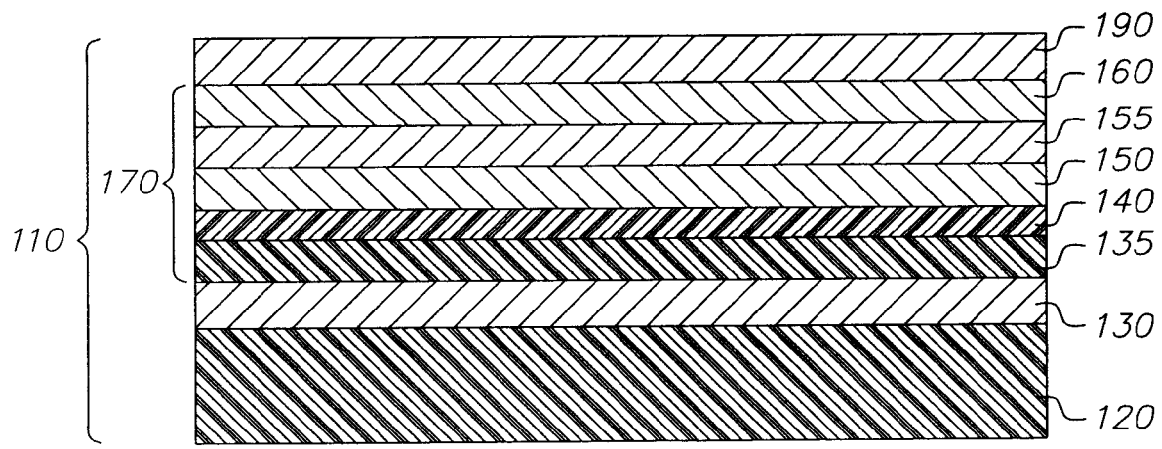
FIG. 6 is a cross-sectional view of an OLED device structure that can be prepared with the present invention.

Turning now to FIG. 6, there is shown a cross-sectional view of a pixel of a light-emitting OLED device 110 that can be prepared in part according to the present invention. The OLED device 110 includes at a minimum a substrate 120, a cathode 190, an anode 130 spaced from cathode 190, and a light-emitting layer 150. The OLED device can also include a hole-injecting layer 135, a hole-transporting layer 140, an electron-transporting layer 155, and an electron-injecting layer 160. Hole-injecting layer 135, hole-transporting layer 140, light-emitting layer 150, electron-transporting layer 155, and electron-injecting layer 160 comprise a series of organic layers 170 disposed between anode 130 and cathode 190. Organic layers 170 are the layers most desirably deposited by the device and method of this invention. These components will be described in more detail.

Substrate 120 can be an organic solid, an inorganic solid, or include organic and inorganic solids. Substrate 120 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 120 can be a homogeneous mixture of materials, a composite of materials, or multiple layers of materials. Substrate 120 can be an OLED substrate, that is a substrate commonly used for preparing OLED devices, e.g. active-matrix low-temperature polysilicon or amorphous-silicon TFT substrate. The substrate 120 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices.

An electrode is formed over substrate 120 and is most commonly configured as an anode 130. When EL emission is viewed through the substrate 120, anode 130 should be transparent or substantially transparent to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable way such as evaporation, sputtering, chemical vapor deposition, or electrochemical means. Anode materials can be patterned using well known photolithographic processes.

While not always necessary, it is often useful that a hole-injecting layer 135 be formed over anode 130 in an organic light-emitting display. The hole-injecting material can serve to improve the film formation property of subsequent organic layers and to facilitate injection of holes into the hole-transporting layer. Suitable materials for use in hole-injecting layer 135 include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide (VOx), molybdenum oxide (MoOx), nickel oxide (NiOx), etc. Alternative hole-injecting materials reportedly useful in organic EL devices are described in EP 0 891 121 A1 and EP 1 029 909 A1.

While not always necessary, it is often useful that a hole-transporting layer 140 be formed and disposed over anode 130. Desired hole-transporting materials can be deposited by any suitable way such as evaporation, sputtering, chemical vapor deposition, electrochemical means, thermal transfer, or laser thermal transfer from a donor material, and can be deposited by the device and method described herein. Hole-transporting materials useful in hole-transporting layer 140 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A

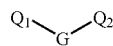

A wherein:

$Q_1$ and $Q_2$ are independently selected aromatic tertiary amine moieties; and G is a linking group such as an arylene, cycloalkylene or alkylene group of a carbon to carbon bond.

In one embodiment, at least one of Q1 or Q2 contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B

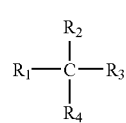

B where:

$R_1$ and $R_2$ each independently represent a hydrogen atom, an aryl group, or an alkyl group or $R_1$ and $R_2$ together represent the atoms completing a cycloalkyl group; and $R_3$ and $R_4$ each independently represent an aryl group, which is in turn substituted with a diaryl substituted amino group, as indicated by structural Formula C

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D

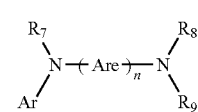

D wherein:

each Are is an independently selected arylene group, such as a phenylene or anthracene moiety;

n is an integer of from 1 to 4; and

Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. The device and method described herein can be used to deposit single- or multi-component layers, and can be used to sequentially deposit multiple layers.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-emitting layer 150 produces light in response to hole-electron recombination. Light-emitting layer 150 is commonly disposed over hole-transporting layer 140. Desired organic light-emitting materials can be deposited by any suitable way such as evaporation, sputtering, chemical vapor deposition, electrochemical means, or radiation thermal transfer from a donor material, and can be deposited by the device and method described herein. Useful organic light-emitting materials are well known. As more fully described in U.S. Pat. Nos. 4,769,292 and 5,935,721, the light-emitting layers of the organic EL element comprise a luminescent or fluorescent material where electroluminescence is produced as a result of electron-hole pair recombination in this region. The light-emitting layers can be comprised of a single material, but more commonly include a host material doped with a guest compound or dopant where light emission comes primarily from the dopant. The dopant is selected to produce color light having a particular spectrum. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. The device and method described herein can be used to coat multi-component guest/host layers without the need for multiple vaporization sources.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

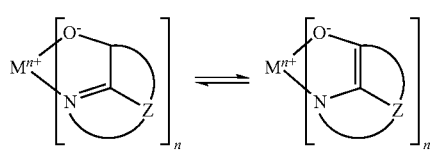

E wherein:

M represents a metal:

n is an integer of from 1 to 3; and

Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

The host material in light-emitting layer 150 can be an anthracene derivative having hydrocarbon or substituted hydrocarbon substituents at the 9 and 10 positions. For example, derivatives of 9,10-di-(2-naphthyl)anthracene constitute one class of useful host materials capable of supporting electroluminescence, and are particularly suitable for light emission of wavelengths longer than 400 nm, e.g., blue, green, yellow, orange or red.

Benzazole derivatives constitute another class of useful host materials capable of supporting electroluminescence, and are particularly suitable for light emission of wavelengths longer than 400 nm, e.g., blue, green, yellow, orange or red. An example of a useful benzazole is 2,2',2"-(1,3,5-phenylene)tris[1-phenyl-1H-benzimidazole].

Desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distyrylbenzene or distyrylbiphenyl, bis(azinyl)methane boron complex compounds, and carbostyryl compounds.

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

While not always necessary, it is often useful that OLED device 110 includes an electron-transporting layer 155 disposed over light-emitting layer 150. Desired electron-transporting materials can be deposited by any suitable way such as evaporation, sputtering, chemical vapor deposition electrochemical means, thermal transfer, or laser thermal transfer from a donor material, and can be deposited by the device and method described herein. Preferred electron-transporting materials for use in electron-transporting layer 155 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S.

Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

An electron-injecting layer 160 can also be present between the cathode and the electron-transporting layer. Examples of electron-injecting materials include alkaline or alkaline earth metals, alkali halide salts, such as LiF mentioned above, or alkaline or alkaline earth metal doped organic layers.

Cathode 190 is formed over the electron-transporting layer 155 or over light-emitting layer 150 if an electron-transporting layer is not used. When light emission is through the anode 130, the cathode material can be comprised of nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through cathode 190, it must be transparent or nearly transparent. For such applications, metals must be thin or one must use transparent conductive oxides, or include these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including but not limited to, through-mask deposition, integral shadow masking as described in U.S. Pat. No. 5,276,380 and EP 0 732 868, laser ablation, and selective chemical vapor deposition.

Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

The invention has been described in detail with particular reference to certain preferred embodiments thereof, but it will be understood that variations and modifications can be effected within the spirit and scope of the invention.

PARTS LIST 5 vaporization apparatus
10 organic material
15 chamber
20 base block
25 first heating region
30 control passage
35 second heating region
40 permeable member
45 vaporization apparatus
50 piston
55 vaporization apparatus
60 manifold
65 liquid
70 shield
75 load lock
80 deposition chamber
85 OLED substrate
90 aperture
95 translational apparatus
100 vacuum source
105 rotating drum
110 OLED device
120 substrate
130 anode
135 hole-injecting layer
140 hole-transporting layer
150 light-emitting layer
155 electron-transporting layer
160 electron-injecting layer
170 organic layers
190 cathode

The invention claimed is:

1. A method for vaporizing organic materials onto a substrate surface to form a film, comprising:
    a) providing a vaporization apparatus for receiving a quantity of organic material that can have one or more components, each one having a different vaporization temperature, and defining a first region and a second region spaced from the first region;
    b) actively cooling the organic material in the first region so that each of the one or more organic components is maintained below its vaporization temperature to reduce degradation of the organic material;
    c) heating the second region of the vaporization apparatus above the vaporization temperature of each of the one or more organic components; and
    d) metering, at a controlled rate, organic material from the first region, through a member permeable to vaporized organic material, into the second region so that a thin cross section of the organic material is heated at a desired rate-dependent vaporization temperature, whereby organic material vaporizes and forms a film on the substrate surface.

2. The method according to claim 1, includes providing a cooling base block surrounding the organic material in the first region and providing a liquid between the cooling base block and the organic material in the first region to provide thermal contact and a vapor-tight seal between the organic material and the cooling base block.

3. The method according to claim 1 wherein the metering step includes metering organic material into the second region at a controlled rate that varies linearly with vaporization rate.

4. The method of claim 1 includes providing a residence time at elevated temperature that permits heating to higher temperatures to achieve substantially higher vaporization rates without material degradation.

5. The method according to claim 1 wherein the metering step includes maintaining a constant volume in the second region so as to establish and maintain a constant plume shape.

6. The method according to claim 1 includes maintaining the first region at a constant temperature as the organic material is consumed.

7. The method according to claim 1 wherein the member permeable to vaporized organic material is a mesh screen.

8. A method for vaporizing organic materials onto a substrate surface to form a film, comprising:
   a) providing a vaporization apparatus for receiving a quantity of organic material that can have one or more components, each one having a different vaporization temperature, and defining a first region and a second region spaced from the first region;
   b) actively cooling the organic material in the first region so that each of the one or more organic components is maintained below its vaporization temperature to reduce degradation of the organic material;
   c) heating the second region of the vaporization apparatus above the vaporization temperature of each of the one or more organic components;
   d) maintaining a steep thermal gradient between the first and second regions; and
   e) metering, at a controlled rate, organic material from the first region into the second region through a member permeable to vaporized organic material so that a thin cross section of the organic material is heated at a desired rate-dependent vaporization temperature, whereby organic material vaporizes and forms a film on the substrate surface.

* * * * *